US008653874B2

(12) United States Patent
Sato et al.

(10) Patent No.: US 8,653,874 B2
(45) Date of Patent: Feb. 18, 2014

(54) SEMICONDUCTOR DEVICE GENERATES COMPLEMENTARY OUTPUT SIGNALS

(75) Inventors: Takenori Sato, Tokyo (JP); Shinya Miyazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/610,541

(22) Filed: Sep. 11, 2012

(65) Prior Publication Data

US 2013/0082743 A1 Apr. 4, 2013

(30) Foreign Application Priority Data

Sep. 29, 2011 (JP) ................................ 2011-213698

(51) Int. Cl.
*H03H 11/16* (2006.01)

(52) U.S. Cl.
USPC .......................................... 327/231; 327/259

(58) Field of Classification Search
None
See application file for complete search history.

(56) References Cited

U.S. PATENT DOCUMENTS 6,292,042 B1 * 9/2001 Kim et al. ..................... 327/257
6,304,122 B1 * 10/2001 Gregor et al. ................. 327/202
6,664,836 B1 * 12/2003 Wen .............................. 327/259
6,680,637 B2 * 1/2004 Seo ............................... 327/175
6,815,994 B2 * 11/2004 Huber et al. .................. 327/257
2008/0265964 A1 * 10/2008 Park ............................. 327/257
2009/0045862 A1 * 2/2009 Kim et al. ..................... 327/256

FOREIGN PATENT DOCUMENTS

JP 2008-112565 A 5/2008

* cited by examiner

*Primary Examiner* — Cassandra Cox
(74) *Attorney, Agent, or Firm* — McGinn IP Law Group, PLLC

(57) ABSTRACT

A splitter circuit in a semiconductor device includes a first inverter that receives an input signal and outputs an inverted signal, a second inverter that receives the inverted signal and outputs a non-inverted signal (a first output signal), a third inverter that receives the input signal and outputs an inverted signal (a second output signal) and an auxiliary inverter that shares an output signal line with the third inverter. The third inverter and the auxiliary inverter use an inverted signal of the input signal as power supplies.

13 Claims, 10 Drawing Sheets

SEMICONDUCTOR DEVICE GENERATES COMPLEMENTARY OUTPUT SIGNALS

BACKGROUND OF THE INVENTION

1. Field of the Invention

The present invention relates to a semiconductor device, and more particularly relates to a semiconductor device that generates complementary output signals based on an input signal.

2. Description of Related Art

Types of signals transmitted inside a semiconductor device include single-ended signals and differential signals. The single-ended signal is a signal of a type that represents 1 bit using one signal wiring, and the single-ended signals are mostly used for control system signals such as clock signals, address signals, and command signals. On the contrary, the differential signal is a signal of a type that represents 1 bit using two (a pair of) signal wirings, and the differential signals are mostly used for data system signals such as an output of a sense amplifier.

However, the differential signals are also used in control system signals, particularly in a circuit part that requires high speed operations. For example, in a high speed DRAM (Dynamic Random Access Memory), a DLL (Delay Locked Loop) circuit that generates phase-controlled internal clock signals is used and read data is output in synchronization with the internal clock signals. The internal clock signals generated by the DLL circuit are single-ended signals; however, the internal clock signals are converted into differential signals near an output driver and the read data is output in synchronization with the differential internal clock signals. A so-called splitter circuit is used for such conversion of internal clock signals.

The splitter circuit is a circuit that splits an input signal into two signal paths and outputs an in-phase signal from one signal path and a reverse-phase signal from the other signal path. Both of the signal paths are formed of a plurality of cascade connected inverters, and the signal path that outputs an in-phase signal includes inverters of even numbered stages and the signal path that outputs a reverse-phase signal includes inverters of odd numbered stages. A strobe output buffer 51 shown in FIG. 3 of Japanese Patent Application Laid-open No. 2008-112565 can be mentioned as an example of the splitter circuit.

However, because two signal paths that form the splitter circuit respectively include inverters of different number of stages, there is a problem that the phases of the generated in-phase signal and the reverse-phase signal do not exactly match. To solve this problem, there has been proposed a method in which a capacitor or a resistor for adjustment are added in each signal path; however, even if a capacitance value and a resistance value are designed to match the phases of the in-phase signal and the reverse phase signal, in most cases, these phases do not exactly match when actually manufactured. Therefore, a trial and error approach is taken in which the capacitance value and the resistance value are changed for many times. However, whenever these values are changed, it becomes necessary to change a mask, and this leads to an increase of its designing cost.

Furthermore, even though these phases are matched according to the design, phase shifting occurs not only due to variations in a manufacturing process but also due to in a temperature change, fluctuations in a power supply voltage or the like after manufacturing.

SUMMARY

In one embodiment of the present invention, there is provided a semiconductor device that includes: a first inverter circuit receiving an input signal and outputting a first inverted signal; a second inverter circuit receiving the first inverted signal and outputting a first output signal; a third inverter circuit receiving the input signal and outputting a second output signal to a signal line; and an auxiliary circuit outputting the second output signal to the signal line in cooperation with the third inverter circuit. The third inverter circuit and the auxiliary circuit operate on a second inverted signal of the input signal as a power supply potential.

In another embodiment of the present invention, there is provided a semiconductor device that includes: a first signal line supplying a first signal; a second signal line supplying a second signal opposite in logic level to the first signal; a first power supply line supplying a first potential; a second power supply line supplying a second potential different from the first potential; first and second transistors of a first conductivity type; and third and fourth transistors of a second conductivity type opposite to the first conductivity type. The first, second, third and fourth transistors are coupled in parallel between the second signal line and a third signal line. The first and third transistors have control electrodes coupled to the first signal line, and the second and fourth transistors have control electrodes coupled to the first and second power supply lines, respectively.

DETAILED DESCRIPTION OF THE EMBODIMENTS

Preferred embodiments of the present invention will be explained below in detail with reference to the accompanying drawings.

Figure 1:
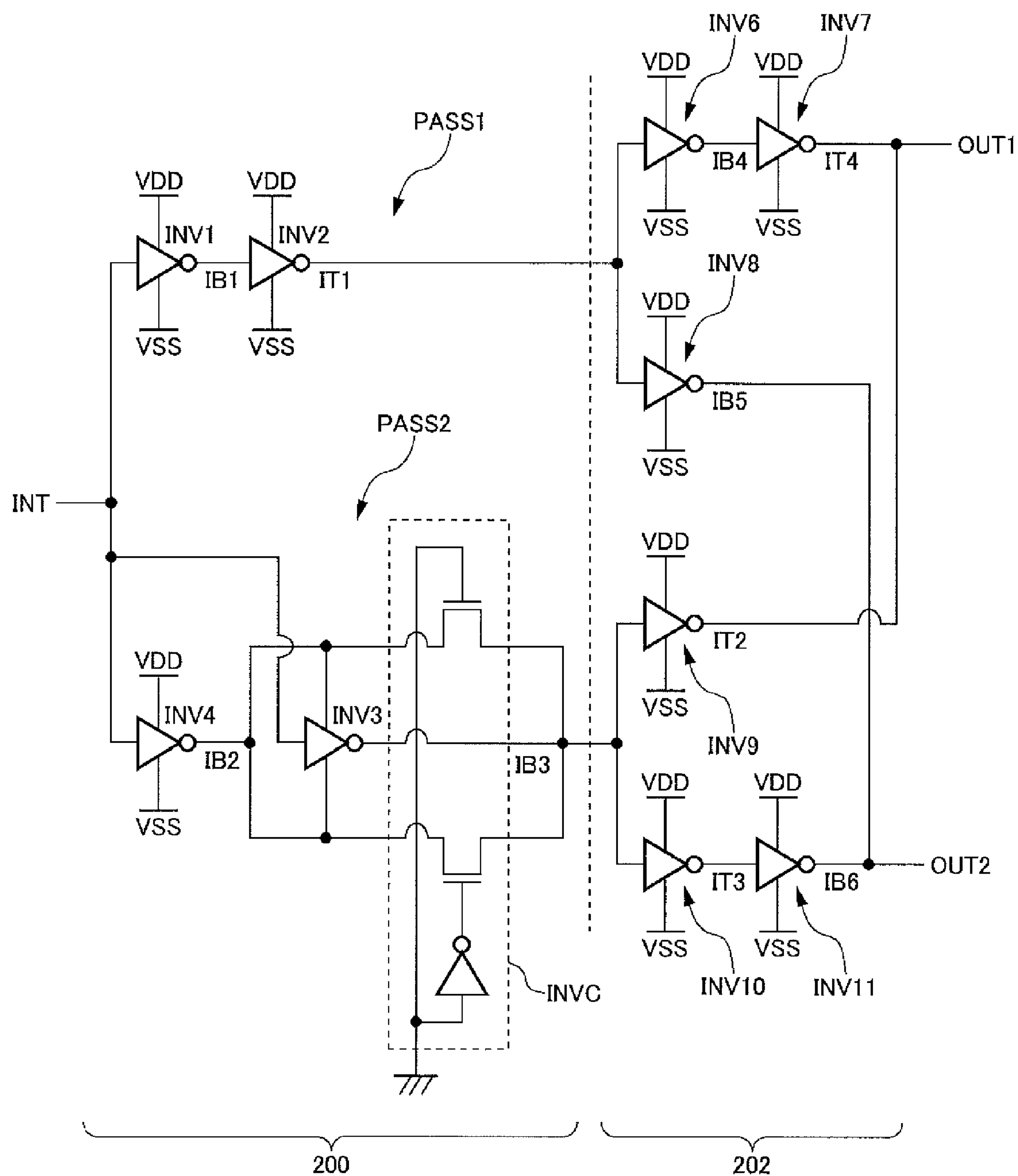
FIG. 1 is a circuit diagram showing a splitter circuit according to an embodiment of the present invention.

Referring now to FIG. 1, the splitter circuit 10 according to an embodiment of the present invention includes a main circuit 200 and a synthesizing circuit 202. The main circuit 200 generates a non-inverted signal IT1 and an inverted signal IB3 complementary to each other from an input signal INT. The main circuit 200 includes a signal path PASS1 that generates the non-inverted signal IT1 (first output signal) from the input signal INT and a signal path PASS2 that generates the inverted signal IB3 (second output signal) from the input signal INT. In the signal path PASS1, two inverters INV1

(first inverter) and INV2 (second inverter) are cascade-connected. In the signal path PASS2, an inverter INV3 (third inverter) is interposed. An auxiliary inverter INVC is installed for the inverter INV3. The inverter INV3 and the auxiliary inverter INVC share an output signal line. Furthermore, an inverter INV4 is installed to control power supplies of the inverter INV3 and the auxiliary inverter INVC.

The inverter INV1 uses a power supply potential VDD and a power supply potential VSS as operation voltage and generates an inverted signal IB1 from the input signal INT. The inverter INV2 also uses a power supply potential VDD and a power supply potential VSS as operation voltage and generates the non-inverted signal IT1 (first output signal) from the inverted signal IB1. That is, the input signal INT and the non-inverted signal IT1 are in same phase.

The inverter INV4 uses a power supply potential VDD and a power supply potential VSS as operation voltage and generates an inverted signal IB2 from the input signal INT. The inverted signal IB2 output from the inverter INV4 is used as operation voltage of the inverter INV3 and the auxiliary inverter INVC. The inverter INV3 generates the inverted signal IB3 (second output signal) from the input signal INT. Gate potentials of two MOS (Metal Oxide Semiconductor) transistors included in the auxiliary inverter INVC are both fixed to an ON potential. Details thereof are explained later with reference to FIG. 2. An output of the auxiliary inverter INVC also becomes the inverted signal IB3. The inverted signal IB3 has a reverse phase to that of the input signal INT.

Duty cycles of the non-inverted signal IT1 and the inverted signal IB3 are also adjusted in the synthesizing circuit 202, and output signals OUT1 and OUT2 complementary to each other are output therefrom. The non-inverted signal IT1 is inverted twice by inverters INV6 and INV7 to be a non-inverted signal IT4 (normal-phase signal). The inverted signal IB3 is inverted once by an inverted INV9 to be a non-inverted signal IT2 (normal-phase signal). The two normal-phase signals are synthesized to obtain the output signal OUT1 (normal-phase signal).

Meanwhile, the non-inverted signal IT1 is inverted once by an inverter INV8 to be an inverted signal IB5 (reverse-phase signal). The inverted signal IB3 is inverted twice by inverters INV10 and INV11 to be an inverted signal IB6 (reverse-phase signal). The two reverse-phase signals are synthesized to obtain the output signal OUT2 (reverse-phase signal).

Figure 2:
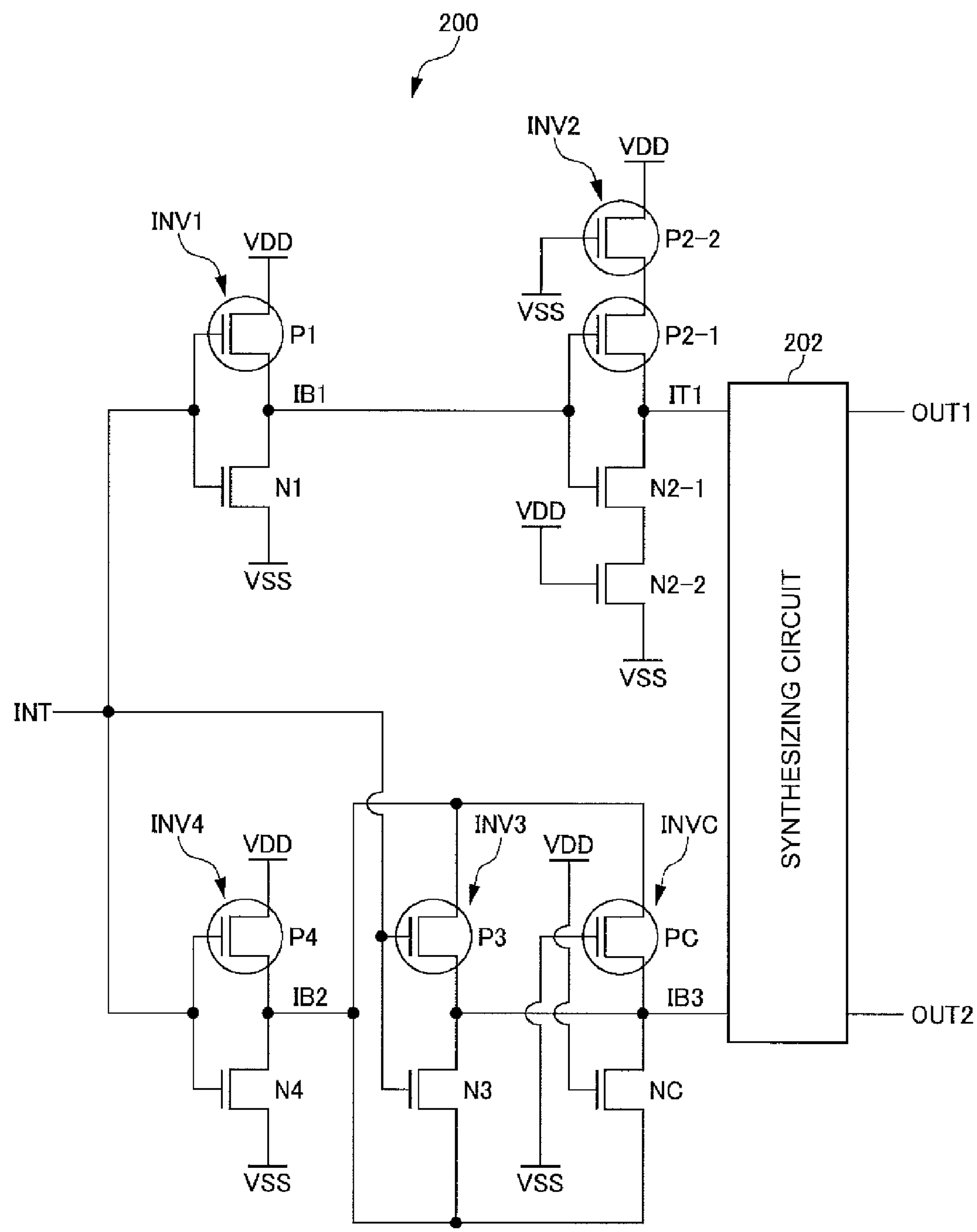
FIG. 2 is a more specific circuit diagram of the splitter circuit.

Turning to FIG. 2, each of the inverters is constituted by a series circuit of a P-channel MOS transistor (first conductivity-type transistor) and an N-channel MOS transistor (second conductivity-type transistor). The individual inverters are specifically explained below.

The inverter INV1 includes a series circuit of transistors P1 and N1. Sources of the transistors P1 and N1 are connected to power supplies VDD and VSS, respectively, and the input signal INT is commonly supplied to gate electrodes of the transistors. The inverted signal IB1 is output from a common drain of the transistors P1 and N1.

The inverter INV2 includes a series circuit of transistors P2-1 and N2-1, and the inverted signal IB1 is commonly supplied to gate electrodes of the transistors. The non-inverted signal IT1 is output from a common drain of the transistors P2-1 and N2-1. A transistor P2-2 is connected between a source of the transistor P2-1 and a power supply VDD. A power supply VSS is supplied to a gate electrode of the transistor P2-2, which fixes the transistor P2-2 to an ON state. A transistor N2-2 is connected between a source of the transistor N2-1 and a power supply VSS. A power supply VDD is supplied to a gate electrode of the transistor N2-2, which fixes the transistor N2-2 to an ON state.

The inverter INV4 includes a series circuit of transistors P4 and N4. Sources of the transistors P4 and N4 are connected to power supplies VDD and VSS, respectively, and the input signal INT is commonly supplied to gate electrodes of the transistors. The inverted signal IB2 is output from a common drain of the transistors P4 and N4.

The inverter INV3 includes a series circuit of transistors P3 and N3. Sources of the transistors P3 and N3 are both connected to an output end (common drain) of the inverter INV4 and the input signal INT is commonly supplied to gate electrodes of the transistors. The inverted signal IB3 is output from a common drain of the transistors P3 and N3.

Furthermore, the auxiliary inverter INVC includes a series circuit of transistors PC and NC. Sources of the transistors PC and NC are both connected to an output end (common drain) of the inverter INV4. A power supply VSS (ON potential) is fixedly supplied to a gate electrode of the transistor PC. A power supply VDD (ON potential) is fixedly supplied to a gate electrode of the transistor NC. The inverted signal IB3 is output from a common drain of the transistors PC and NC. In other words, the common drain of the inverter INV3 and the common drain of the auxiliary inverter INVC have the same potential.

In the present embodiment, channel widths of the N-channel MOS transistors N1, N2-1, N2-2, N3, and N4 are designed to be equal to each other. Accordingly, ON resistances of the N-channel MOS transistors N1, N2-1, N2-2, N3, and N4 are equal to each other. Similarly, channel widths of the P-channel MOS transistors P1, P2-1, P2-2, P3, and P4 are designed to be equal to each other. Accordingly, ON resistances of the P-channel MOS transistors P1, P2-1, P2-2, P3, and P4 are also equal to each other. Because ON resistances of an N-channel MOS transistor and a P-channel MOS transistor that constitute one inverter are designed to be equal, the ON resistances of the transistors N1, N2-1, N2-2, N3, N4, P1, P2-1, P2-2, P3, and P4 are equal to each other.

Figure 3:
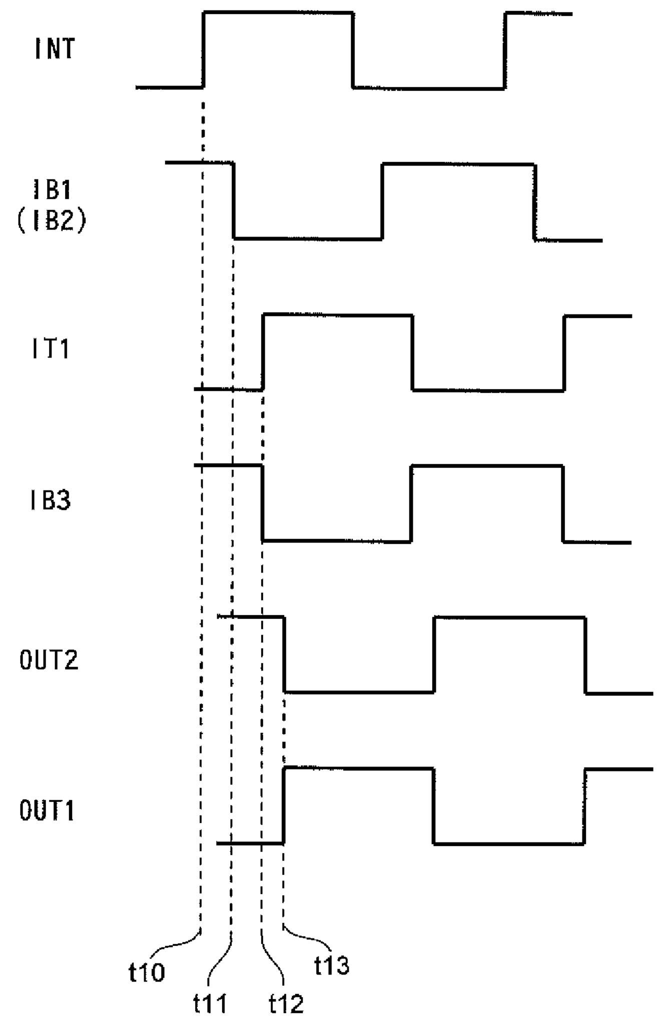
FIG. 3 is a waveform diagram for explaining operations of the splitter circuit.

Turning to FIG. 3, when the input signal INT changes from a low level to a high level at a time t10, the inverters INV1, INV4, and INV3 that receive the input signal INT seek to invert outputs thereof. However, because the power supply of the inverter INV3 is the inverted signal IB2 output from the inverter INV4, the inverter INV3 cannot invert the output signal (the inverted signal IB3) (that is, cannot change the output signal to a low level) until the inverted signal IB2 changes from a high level to a low level. Accordingly, after the inverted signals IB1 and IB2 change from a high level to a low level at a time t11, the inverted signal IB3 changes from a high level to a low level at a time t12.

Because the time t12 corresponds to a timing when next-stage logic circuits that receive the inverted signals IB1 and IB2 after the inverted signals IB1 and IB2 have changed from a high level to a low level and, the non-inverted signal IT1 output from the inverter INV2 also changes at the time t12. That is, the inverters INV2 and INV3 simultaneously change at the time 12. As a result, the output signals OUT1 and OUT2 output from the synthesizing circuit 202 also simultaneously change at a time t13. An operation performed when the input signal INT is changes from a high level to a low level is the same.

Figure 4:
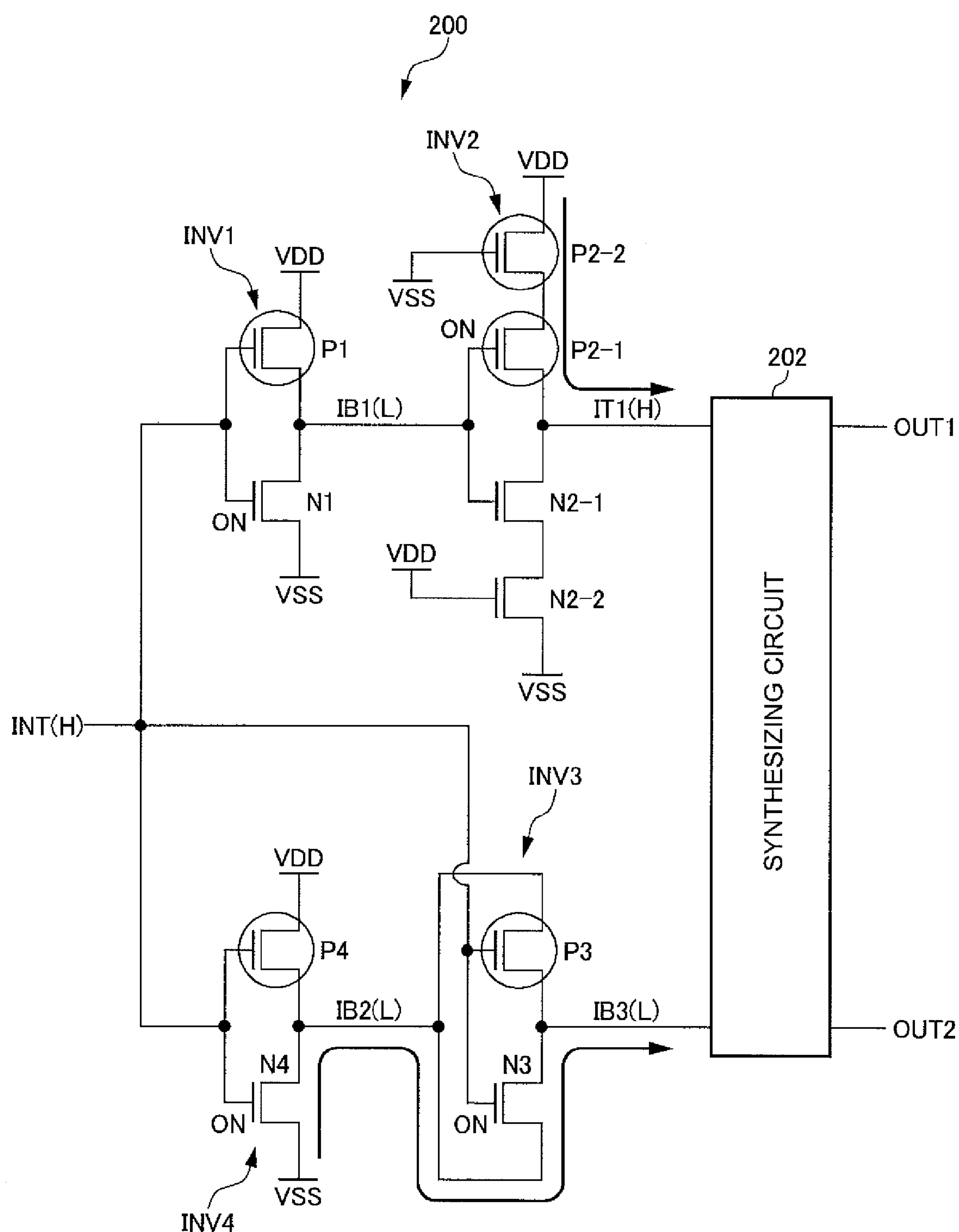
FIG. 4 is a schematic diagram for explaining an operation performed by the splitter circuit that does not include the auxiliary inverter INVC.

FIG. 4 is a schematic diagram for explaining an operation performed by the splitter circuit 10 that does not include the auxiliary inverter INVC. It is assumed that the input signal INT changes from a low level to a high level. Because the transistor N1 of the inverter INV1 is turned on, the inverted signal IB1 changes from a high level to a low level. In the inverter INV2, the transistor P2-1 is turned on and accordingly the common drain which is the output end of the inverter is connected to the power supply VDD via the transistors P2-2 and P2-1. That is, the non-inverted signal IT1 has a high level.

Meanwhile, the transistor N4 of the inverter INV4 is turned on and the inverted signal IB2 also changes from a high level to a low level as the inverted signal IB1. Because the input signal INT turns on the transistor N3 of the inverter INV3, the common drain which is the output end of the inverter is connected to the power supply VSS via the transistors N3 and N4. As a result, the inverted signal IB3 has a low level.

When series resistances of the transistors P2-2 and P2-1 and series resistances of the transistors N4 and N3 are designed to be equal, the non-inverted signal IT1 and the inverted signal IB3 are expected to change at the same timing. The same holds true for a case when the input signal INT changes from a high level to a low level.

However, when an operation speed (an operation frequency) of the splitter circuit 10 is increased, a timing of the inverted signal IB3 is delayed from the non-inverted signal IT1. The transistor P2-1 is turned on when a potential of the gate becomes smaller than a potential of the source by a predetermined threshold or larger. On the other hand, the transistor N3 is turned on when the gate potential becomes larger than the source potential by a predetermined threshold or larger. While the high potential VDD is constantly supplied to the source of the transistor P2-1, the source potential of the transistor N3 depends on an output from the inverter INV4. It is considered that this difference in operation conditions causes a phase shift during a high-speed operation. Accordingly, in the present embodiment, the auxiliary inverter INVC is added to speed up a response of the inverted signal IB.

Figure 5:
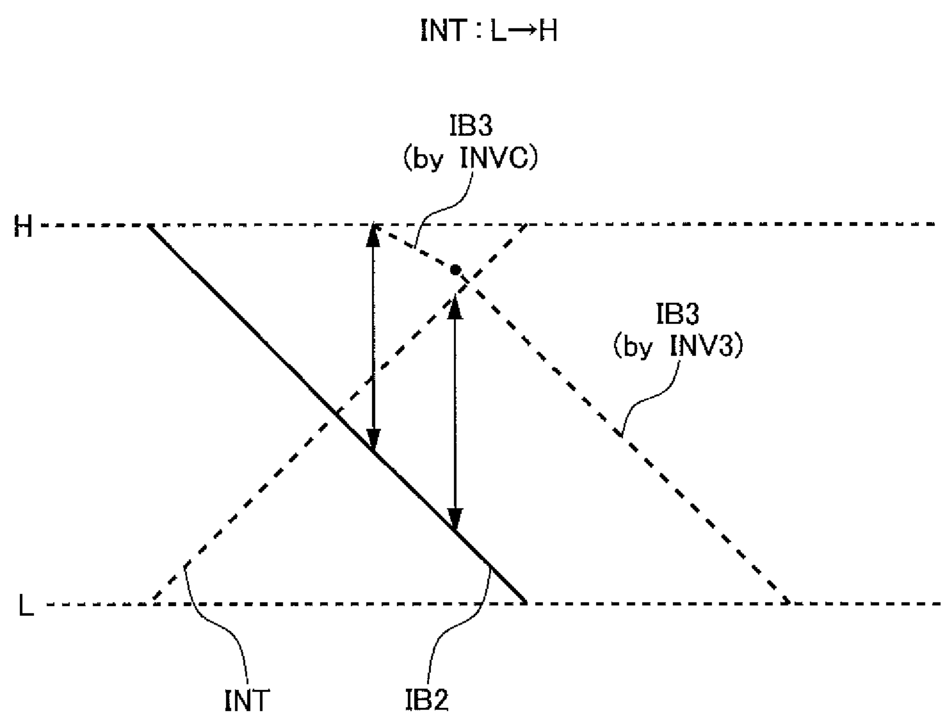
FIG. 5 is a schematic diagram of a signal waveform obtained when the input signal INT changes from a low level to a high level.

As shown in FIG. 5, when the input signal INT changes from a low level to a high level, the potential of the input signal INT gradually increases from a low level to a high level for a very short period. The transistor N3 is turned on when the input signal INT becomes sufficiently high and the inverted signal IB2 becomes sufficiently low. On the other hand, the transistor NC of the auxiliary inverter INVC is turned on when the inverted signal IB2 becomes sufficiently low. This is because the gate potential of the transistor NC is fixed to the ON potential VDD.

In other words, because the transistor P2-2 has the source potential fixed to the ON potential VSS, the transistor P2-1 is substantially controlled by one signal of the inverted signal IB1. The transistor NC has the gate potential fixed to the ON potential VDD and thus is substantially controlled by one signal of the inverted signal IB2. When the input signal INT changes from a low level to a high level, the operation condition of the signal path PASS2 shown in FIG. 1 matches with the operation condition of the signal path PASS1 by employing the auxiliary inverter INVC.

Figure 6:
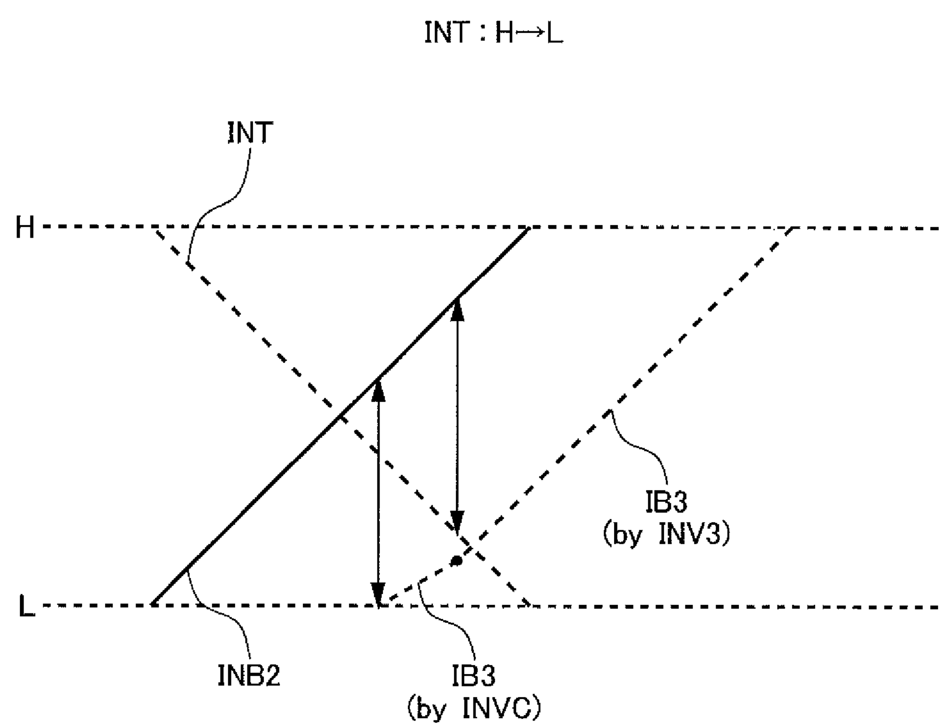
FIG. 6 is a schematic diagram of a signal waveform obtained when the input signal INT changes from a high level to a low level.

As shown in FIG. 6, when the input signal INT changes from a high level to a low level, the potential of the input signal INT gradually decreases from a high level to a low level for a very short period. The transistor P3 is turned on when the input signal INT becomes sufficiently low and the inverted signal IB2 becomes sufficiently high. On the other hand, the transistor PC of the auxiliary inverter INVC is turned on when the inverted signal IB2 becomes sufficiently high. When the input signal INT changes from a high level to a low level, the operation condition of the signal path PASS2 shown in FIG. 1 also matches with the operation condition of the signal path PASS1 by employing the auxiliary inverter INVC.

Figure 7:
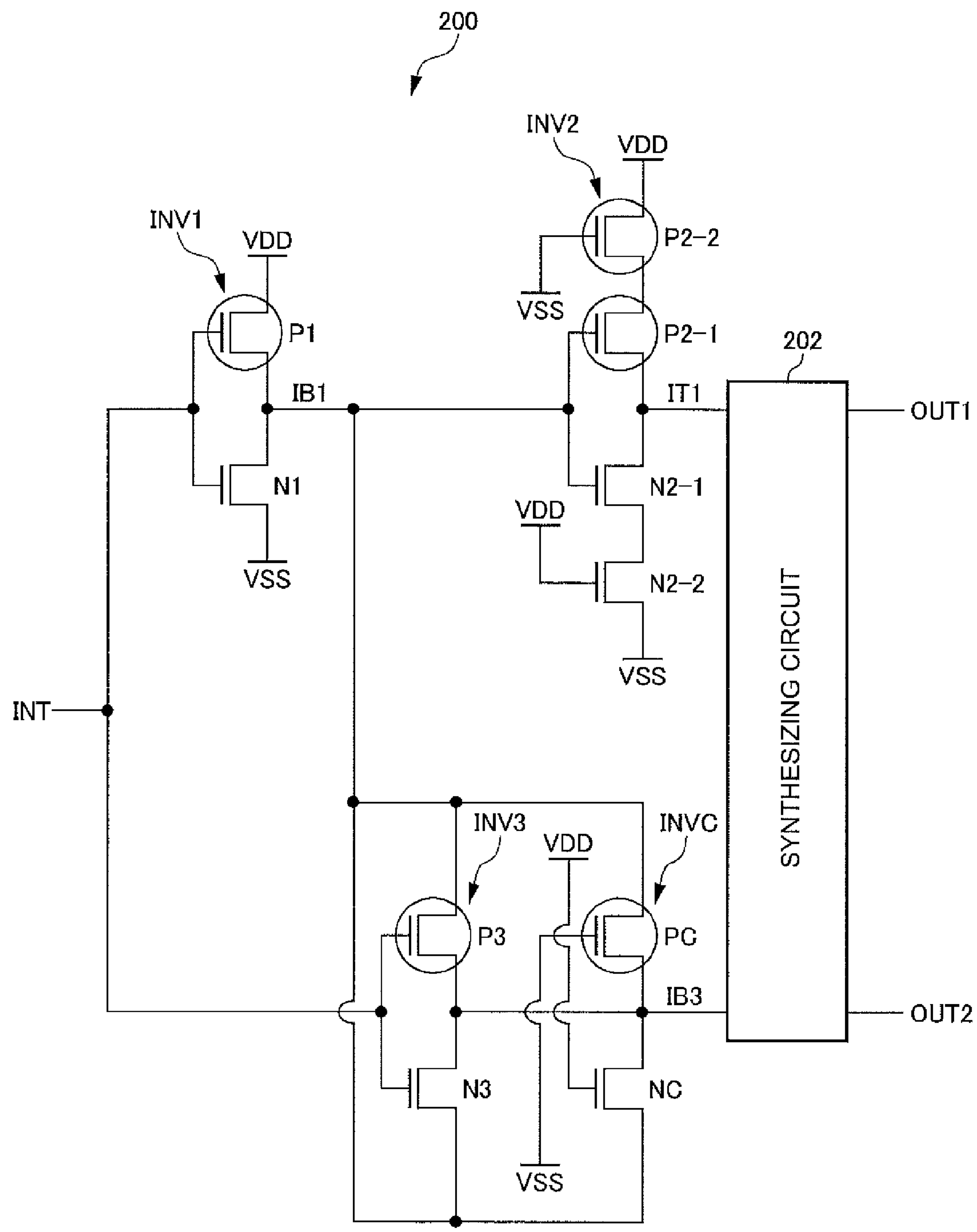
FIG. 7 is a modification of the configuration of the splitter circuit.

In FIG. 7, the operation power supplies of the inverter INV3 and the auxiliary inverter INVC are the inverted signal IB1 output from the inverter INV1, not the inverted signal IB2 output from the inverter INV4. Because the inverted signals IB1 and IB2 are in same phase and of the same level, such a configuration is also possible.

Figure 8:
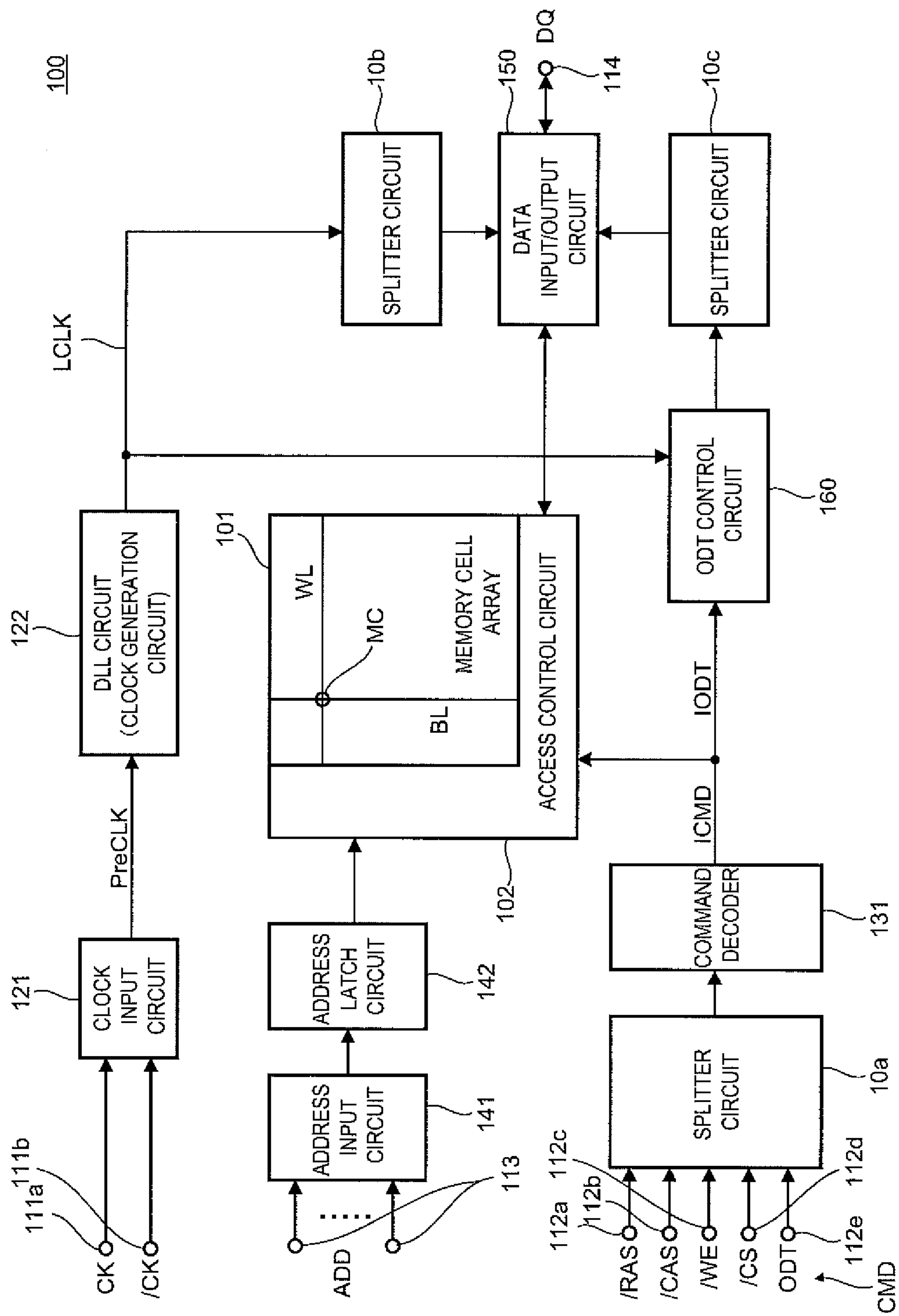
FIG. 8 is a block diagram showing an example of a semiconductor device using the splitter circuit.

A semiconductor device using the splitter circuit 10 described above is explained with reference to FIG. 8.

A semiconductor device 100 according to the present embodiment is a synchronous DRAM (Dynamic Random Access Memory), and includes, as external terminals, clock terminals 111*a* and 111*b*, command terminals 112*a* to 112*e*, address terminals 113, and a data input/output terminal 114. While the semiconductor device 100 also includes a data strobe terminal, a power supply terminal or the like, these terminals are not shown in FIG. 8.

The clock terminals 111*a* and 111*b* are terminals to which external clocks CK and /CK are respectively supplied. These external clocks CK and /CK are then supplied to a clock input circuit 121. In the present specification, a signal with a "/ (slash)" at the beginning of a signal name means that the signal is an inverted signal of a corresponding signal or a low-active signal. Therefore, the external clocks CK and /CK are complementary to each other. The clock input circuit 121 generates an internal clock PreCLK based on the external clocks CK and /CK, and supplies the internal clock PreCLK to a DLL circuit 122. The DLL circuit 122 functions as a clock generation circuit that generates a phase-controlled internal clock signal LCLK based on the internal clock PreCLK, and supplies the generated internal clock signal LCLK to a splitter circuit 10*b*, an ODT control circuit 160 or the like.

The command terminals 112*a* to 112*e* are terminals to which a row address strobe signal /RAS, a column address strobe signal /CAS, a write enable signal /WE, a chip selection signal /CS, and an on-die termination signal ODT are respectively supplied. These command signals CMD are supplied to a command decoder 131 via a splitter circuit 10*a*. The command decoder 131 is a circuit that generates various internal commands ICMD that include an internal on-die termination signal IODT by performing holding, decoding, and counting of the command signals CMD. The generated internal commands ICMD are supplied to an access control circuit 102. Among the internal commands ICMD, the internal on-die termination signal IODT is supplied to a splitter circuit 10*c* via the ODT control circuit 160. The internal on-die termination signal IODT is a signal that causes a data input/output circuit 150 to function as a terminal resistor. The ODT control circuit 160 is a circuit that synchronizes a phase of the internal on-die termination signal IODT with a phase of the internal clock signal LCLK.

The address terminals 113 are terminals to which an address signal ADD is supplied. The address signal ADD is then supplied to an address input circuit 141. An output of the address input circuit 141 is supplied to an address latch circuit 142. A latched address signal ADD is supplied to the access control circuit 102.

The access control circuit 102 is a circuit that controls access operations to any memory cell MC included in a memory cell array 101 based on the internal commands ICMD and the address signal ADD. The memory cell MC is arranged at an intersection of a word line WL and a bit line BL. The word line WL and the bit line BL are selected based on the address signal ADD. For example, when the internal command ICMD indicates a read operation, a predetermined memory cell is selected by the address signal ADD and the read data that is read from the pertinent memory cell is output to the outside via the data input/output circuit 150 and the data input/output terminal 114. When the internal command ICMD indicates a write operation, write data that is input into the data input/output circuit 150 via the data input/output terminal 114 is written to a specified memory cell by the address signal ADD.

The splitter circuit 10 according to the present invention is used at several parts in this type of semiconductor device 100. In this example, the splitter circuit 10 is used as the splitter circuit 10*a* that supplies each bit of the command signals CMD to the command decoder 131, as the splitter circuit 10*b* that supplies the internal clock signal LCLK to the data input/output circuit 150, and as the splitter circuit 10*c* that supplies the internal on-die termination signal IODT to the data input/output circuit 150.

Figure 9:
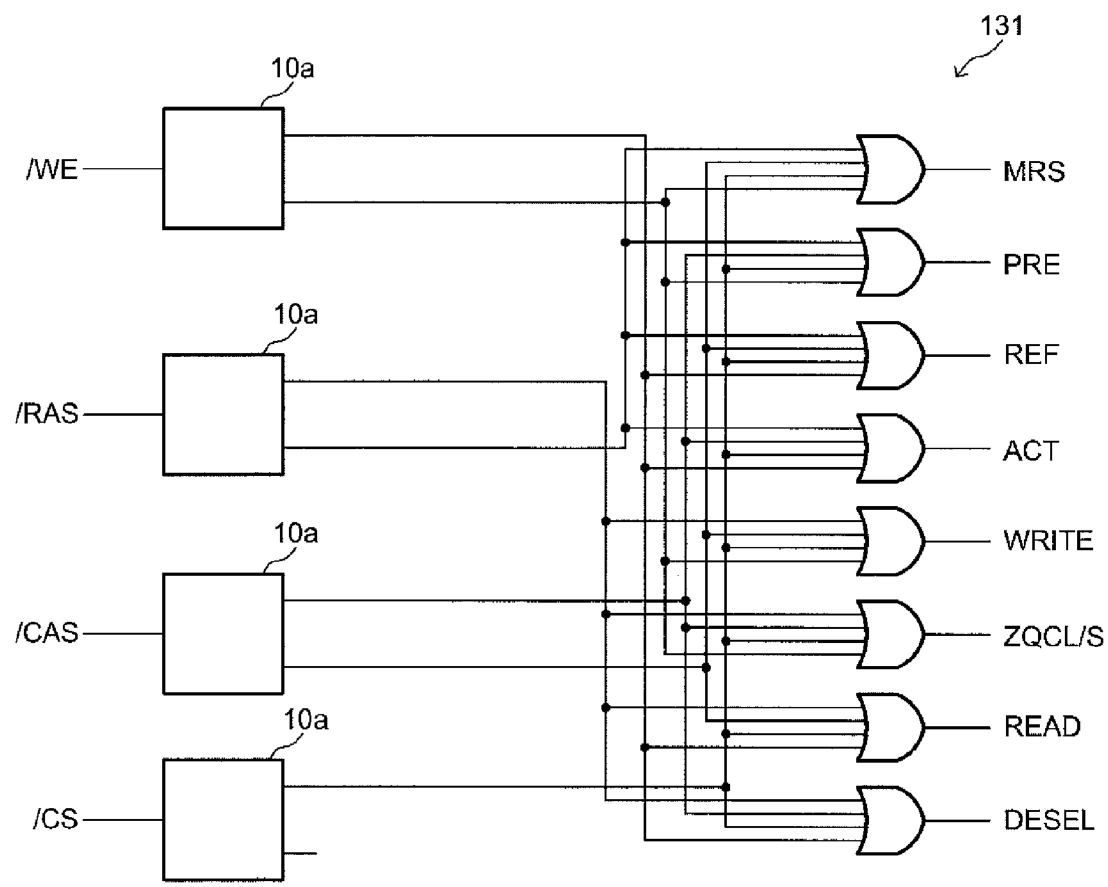
FIG. 9 is a circuit diagram showing main parts of splitter circuits and a command decoder.

As shown in FIG. 9, the command decoder 131 activates any one of the various internal commands ICMD (such as MRS, PRE, REF, ACT, WRITE, ZQCL/S, READ, and DESEL) based on a combination of logical levels of all the bits of the command signals CMD. The command decoder 131 is a circuit type that receives each bit of the command signals CMD in a differential type. Therefore, the splitter circuit 10*a* is required in the preceding stage of the command decoder 131 to convert each bit of the command signals CMD into a differential type. If the splitter circuit 10 shown in FIG. 1 is used in this kind of circuit part, the differential signal whose phases are matched is supplied to the command decoder 131. As a result, the operation margin of the command decoder 131 is increased.

Figure 10:
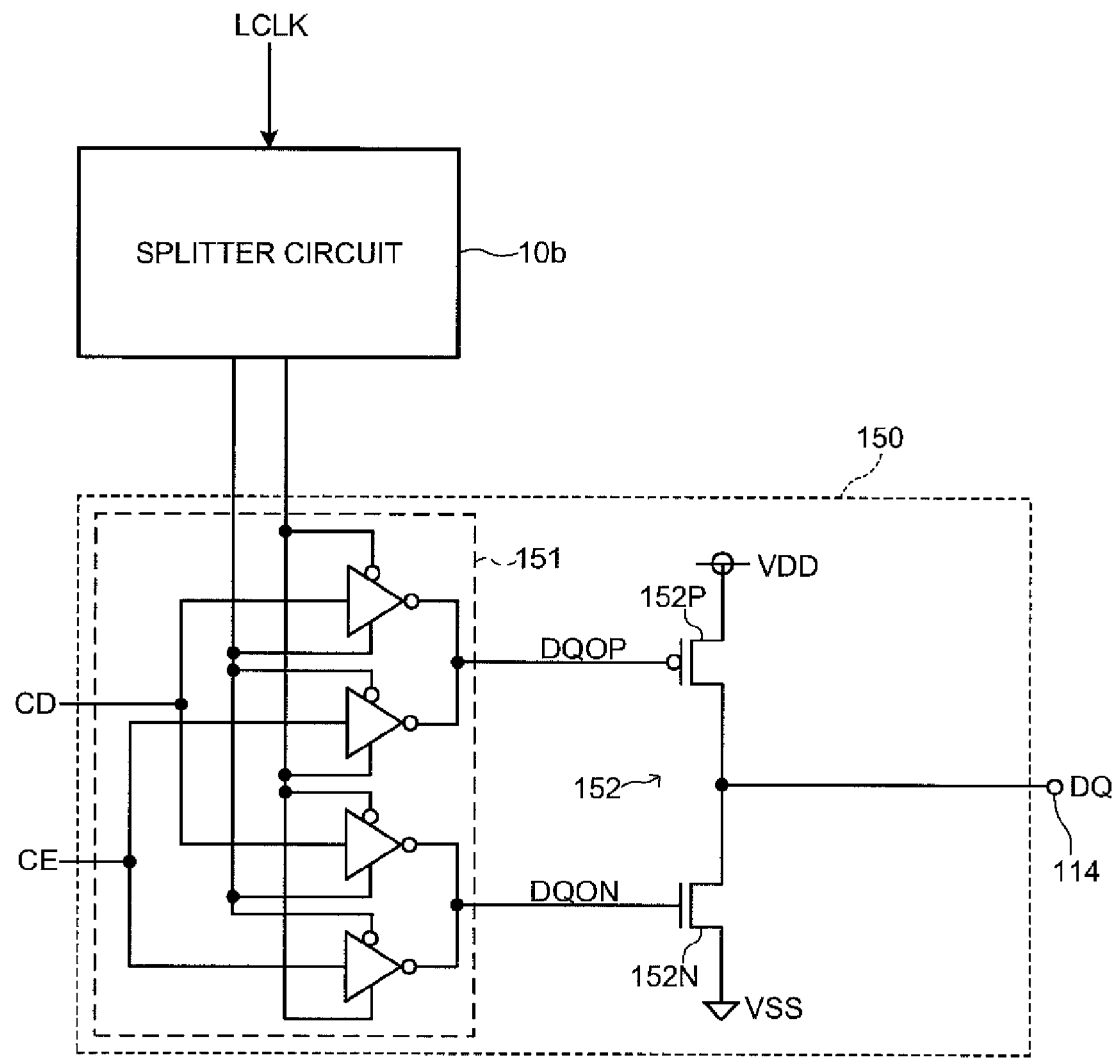
FIG. 10 is a circuit diagram showing main parts of a splitter circuit and a data input/output circuit.

As shown in FIG. 10, the data input/output circuit 150 includes a timing adjusting circuit 151 that synchronizes read data CD and CE with the internal clock signal LCLK, and an output driver 152 that drives the data input/output terminal 114 based on output signals DQOP and DQON of the timing adjusting circuit 151. The output driver 152 is constituted by a P-channel MOS transistor 152P and an N-channel MOS transistor 152N that are serially connected between the power supplies VDD and VSS. The output signals DQOP and DQON are respectively supplied to gate electrodes of the transistors 152P and 152N.

Because the timing adjusting circuit 151 is a circuit that receives the internal clock signal LCLK in a differential type and adjusts rising edges and falling edges of the output signals DQOP and DQON based on the received signal, the splitter circuit 10*b* is required to convert the internal clock signal LCLK into a differential type. When the splitter circuit 10 shown in FIG. 1 is used in this kind of circuit part, the differential internal clock signal LCLK whose phases are matched is supplied to the timing adjusting circuit 151, thereby improving the signal quality of read data output from the output driver 152.

The internal on-die termination signal IODT that is phase controlled by the internal clock signal LCLK is converted into a differential signal by the splitter circuit 10*c*, and then supplied to the data input/output circuit 150. The internal on-die termination signal IODT is a signal that causes the data input/output circuit 150 (the data input/output terminal 114 when viewed from outside of a chip) to function as the terminal resistor. Similarly to the output operation of the read data, it is necessary to precisely control an operation timing of the output driver 152. When the splitter circuit 10 shown in FIG. 1 is used in this kind of circuit part, the differential internal on-die termination signal IODT having no deviation in timing is supplied to the data input/output circuit 150, thereby enabling to perform a precise ODT operation.

It is apparent that the present invention is not limited to the above embodiments, but may be modified and changed without departing from the scope and spirit of the invention.

For example, in the present invention, it is not necessary to form two signal paths constituting a splitter circuit using inverters, and some of the inverters can be replaced with other logic circuits (NAND gate circuit, NOR gate circuit or the like).

What is claimed is:

1. A semiconductor device comprising:

a first inverter circuit receiving an input signal and outputting a first inverted signal;

a second inverter circuit receiving the first inverted signal and outputting a first output signal;

a third inverter circuit receiving the input signal and outputting a second output signal to a signal line; and an auxiliary circuit outputting the second output signal to the signal line in cooperation with the third inverter circuit, wherein the third inverter circuit and the auxiliary circuit operate on a second inverted signal of the input signal as a power supply potential.

2. The semiconductor device as claimed in claim 1, wherein the first inverted signal and the second inverted signal are the same signal.

3. The semiconductor device as claimed in claim 1, further comprising a fourth inverter circuit receiving the input signal and outputting the second inverted signal.

4. The semiconductor device as claimed in claim 1, wherein the auxiliary circuit includes a first transistor of a first conductivity type and a second transistor of a second conductivity type, each of the first and second transistors having a control electrode supplied with an active potential so that the first and second transistors are fixed to an ON state.

5. The semiconductor device as claimed in claim 1, further comprising a synthesizing circuit that synthesizes the first and second output signals.

6. The semiconductor device as claimed in claim 5, wherein the synthesizing circuit synthesizes a signal obtained by inverting one of the first and second output signals an even number of times and a signal obtained by inverting the other of the first and second output signals an odd number of times.

7. The semiconductor device as claimed in claim 1, further comprising a command decoder that decodes a command signal supplied from outside, wherein the input signal is each of bits of the command signal, and the first and second output signals are supplied to the command decoder.

8. The semiconductor device as claimed in claim 1, further comprising:

a clock generation circuit generating an internal clock signal that is phase-controlled; and an output driver circuit outputting a data signal in synchronism with the internal clock signal, wherein the input signal is the internal clock signal, and the first and second output signals are supplied to the output driver circuit.

9. The semiconductor device as claimed in claim 1, further comprising:

an ODT control circuit generating an internal on-die termination signal that is phase-controlled; and a data input/output circuit that causes a data input/output terminal to function as a termination resistor in synchronism with the internal on-die termination signal, wherein the input signal is the internal on-die termination signal, and the first and second output signals are supplied to the data input/output circuit.

10. A semiconductor device comprising:

a first signal line supplying a first signal;

a second signal line supplying a second signal opposite in logic level to the first signal;

a first power supply line supplying a first potential;

a second power supply line supplying a second potential different from the first potential;

first and second transistors of a first conductivity type; and third and fourth transistors of a second conductivity type opposite to the first conductivity type, wherein the first, second, third and fourth transistors are coupled in parallel between the second signal line and a third signal line, the first and third transistors have control electrodes coupled to the first signal line, and the second and fourth transistors have control electrodes coupled to the first and second power supply lines, respectively.

11. The semiconductor device as claimed in claim 10, further comprising:

fifth and sixth transistors of the first conductivity type coupled in series between the second power supply line and a fourth signal line; and seventh and eighth transistors of the second conductivity type coupled in series between the first power supply line and the fourth signal line, wherein the fifth and seventh transistors have control electrodes supplied with the second signal, and the sixth and eighth transistors have control electrodes coupled to the first and second power supply lines, respectively.

12. The semiconductor device as claimed in claim 11, further comprising a synthesizing circuit receiving a third signal on the third signal line and a fourth signal on the fourth signal line.

13. The semiconductor device as claimed in claim 12, wherein the synthesizing circuit includes a first circuit that synthesizes the third signal and an inverted signal of the fourth signal and a second circuit that synthesizes the fourth signal and an inverted signal of the third signal.

* * * * *